US006958280B2

(12) United States Patent
Kim

(10) Patent No.: US 6,958,280 B2
(45) Date of Patent: Oct. 25, 2005

(54) METHOD FOR MANUFACTURING ALIGNMENT MARK OF SEMICONDUCTOR DEVICE USING STI PROCESS

(75) Inventor: Hyung Hwan Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 33 days.

(21) Appl. No.: 10/737,784

(22) Filed: Dec. 18, 2003

(65) Prior Publication Data

US 2004/0266127 A1 Dec. 30, 2004

(30) Foreign Application Priority Data

Jun. 30, 2003 (KR) ..................... 10-2003-0043821

(51) Int. Cl.[7] ............................................... H01L 21/76

(52) U.S. Cl. ...................... 438/401; 438/404; 438/424; 438/427

(58) Field of Search ................................ 438/401, 404, 438/424, 427, 219

(56) References Cited

U.S. PATENT DOCUMENTS

| | | | | |
|---|---|---|---|---|
| 6,043,133 | A | 3/2000 | Jang et al. | 439/401 X |
| 6,049,137 | A | 4/2000 | Jang et al. | 297/797 |
| 6,194,287 | B1 | 2/2001 | Jang | 439/427 |
| 6,232,200 | B1 | 5/2001 | Chu | 438/401 |
| 6,303,458 | B1 | 10/2001 | Zhang et al. | 438/401 |
| 6,429,136 | B2 * | 8/2002 | Miwa | 438/692 |
| 6,534,378 | B1 | 3/2003 | Ramkumar et al. | 438/401 X |
| 2001/0026994 | A1 * | 10/2001 | Watanabe | 438/424 |
| 2004/0048441 | A1 * | 3/2004 | Akatsu et al. | 438/386 |

* cited by examiner

*Primary Examiner*—William M. Brewster
(74) *Attorney, Agent, or Firm*—Heller Ehrman

(57) ABSTRACT

The present invention discloses method for manufacturing alignment mark wherein a predetermined thickness of a device isolation film is etched prior to removing a pad nitride film during a shallow trench isolation process to increase contrast. In accordance with the method, a pad nitride film pattern and a pad oxide film pattern exposing a predetermined portion of the semiconductor substrate are formed. The semiconductor substrate is etched using the pad nitride film pattern as a mask to form an alignment mark trench. A device isolation film is formed in the trench and a predetermined thickness of the device isolation film is etched to form an alignment mark. The pad nitride film pattern is then removed.

7 Claims, 3 Drawing Sheets

METHOD FOR MANUFACTURING ALIGNMENT MARK OF SEMICONDUCTOR DEVICE USING STI PROCESS

BACKGROUND OF THE INVENTION

1. Field of the Invention

The present invention relates to method for manufacturing alignment mark of semiconductor device, and in particular to an improved method for manufacturing alignment mark wherein a predetermined thickness of a device isolation film is etched prior to removing a pad nitride film during a STI (Shallow Trench Isolation) process to increase contrast for improving recognition capability of the alignment mark, thereby improving yield and reliability of semiconductor device.

2. Description of the Background Art

Generally, a semiconductor device comprises an active region where devices are formed and a device isolation region for defining the active region. In order to align masks accurately during subsequent processes, alignment marks are formed. One of the methods for forming alignment marks is by using STI trenches. That is, STI trenches filled with a device isolation film are formed and contrast generated due to a step difference between the device isolation film and the active region is compared to perform an alignment.

FIGS. 1*a* through 1*c* are cross-sectional diagram illustrating a conventional method for manufacturing alignment mark of semiconductor device. Only an alignment mark region is shown in FIGS. 1*a* through 1*c*.

Referring to FIG. 1*a*, a pad oxide film (not shown) and a pad nitride film (not shown) are sequentially formed on a semiconductor substrate 10. The pad nitride film and the pad oxide film are etched via a photoetching process using a device isolation mask to form a pad nitride film pattern 14 and a pad oxide film pattern 12. The semiconductor substrate 10 is then etched using the pad nitride film pattern 14 as a mask to form an alignment mark trench 16.

Thereafter, a well oxide film 18 and a liner nitride film 20 are formed on an inner wall of the alignment mark trench 16. An oxide film for device isolation film (not shown) filling the alignment mark trench 16 is then formed on the entire surface. The oxide film for device isolation film is planarized until the pad nitride film pattern 14 is exposed to form a device isolation film 22.

Referring to FIG. 1*b*, the pad nitride film pattern 14 is removed.

Now referring to FIG. 1*c*, the device isolation film 22 is etched via a photoetching process using an alignment mark mask to form an alignment mark 24.

FIG. 2 is a photograph showing a plane view of various alignment marks. An alignment process may be performed by recognizing contrast generated due to a step difference between these alignment marks and adjacent layers. That is, in accordance with the conventional method for manufacturing alignment mark shown in FIGS. 1*a* through 1*c*, a predetermined thickness of the device isolation film is etched to increase the step difference between the device isolation film and the active region so that the contrast ratio is increased. However, in a CMP (Chemical Mechanical Polishing) process using HSS (High Selectivity Slurry), the thickness of the pad nitride film is relatively small in order to obtain better gap-filling characteristics. In this case, only small step difference is generated during the removal process of the pad nitride film pattern as shown in FIG. 3.

Therefore, an accurate alignment in subsequent process using the contrast ratio is not possible due to the small step difference.

SUMMARY OF THE INVENTION

Accordingly, it is an object of the present invention to provide a method for manufacturing alignment mark of semiconductor device wherein a predetermined thickness of a device isolation film is etched prior to removing a pad nitride film during a STI process to increase contrast for improving recognition capability of the alignment mark, thereby improving yield and reliability of semiconductor device.

In order to achieve the above-described object of the invention, there is provided a method for manufacturing alignment mark of semiconductor device, comprising the steps of: sequentially forming an pad oxide film and a pad nitride film on a semiconductor substrate; selectively etching the pad nitride film and the pad oxide film to form a pad nitride film pattern and a pad oxide film pattern exposing a predetermined portion of the semiconductor substrate; etching the semiconductor substrate using the pad nitride film pattern as a mask to form an alignment mark trench having a predetermined depth; forming an oxide film for device isolation film filling the alignment mark trench on the entire surface; planarizing the oxide film for device isolation film until the pad nitride film pattern is exposed to form a device isolation film; etching a predetermined thickness of the device isolation film to form an alignment mark; and removing the pad nitride film pattern.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A method for manufacturing alignment mark of semiconductor device in accordance with a preferred embodiment of the present invention will now be described in detail with reference to the accompanying drawings.

Figure 1A:
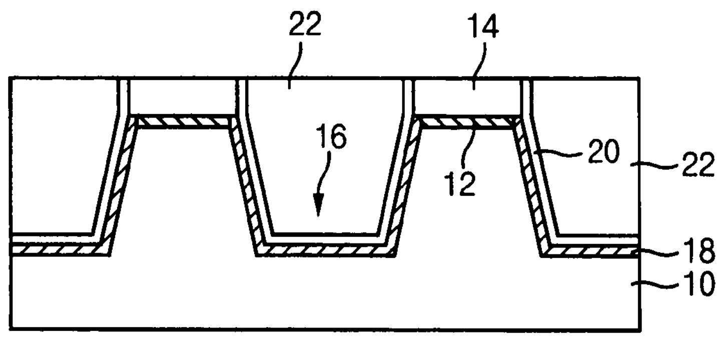
FIGS. 1*a* through 1*c* are cross-sectional diagram illustrating a conventional method for manufacturing alignment mark of semiconductor device.
Figure 1B:
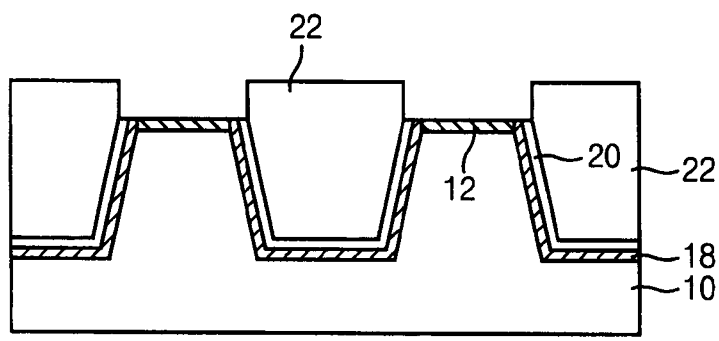
Figure 1C:
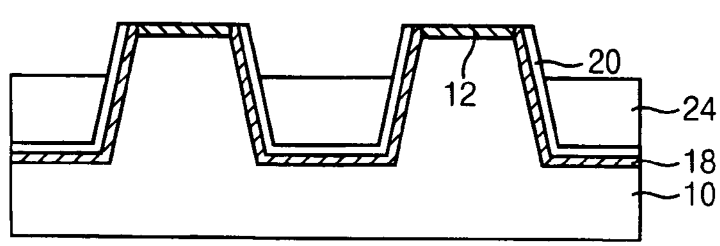
Figure 2:
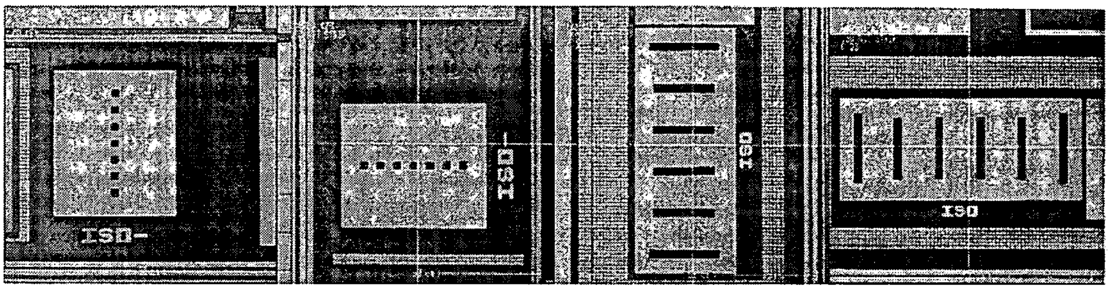
FIG. 2 is a photograph showing a plane view of various alignment marks.
Figure 3:
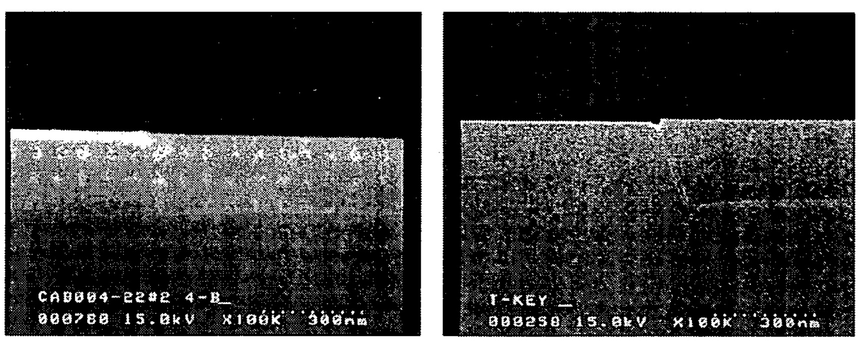
FIG. 3 is a photograph showing a cross-sectional view of an alignment mark manufactured in accordance with the conventional method.
Figure 4A:
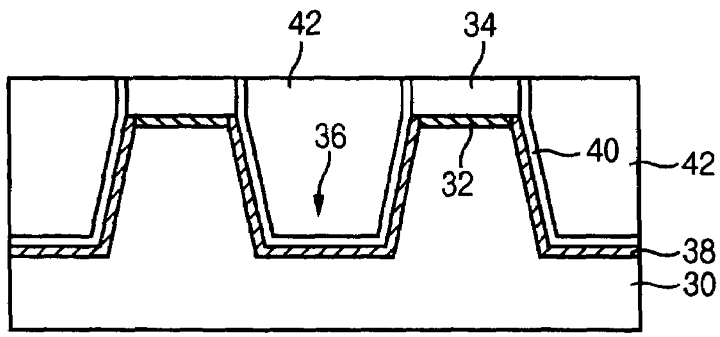
FIGS. 4*a* through 4*c* are cross-sectional diagram illustrating a method for manufacturing alignment mark of semiconductor device in accordance with the present invention.
Figure 4B:
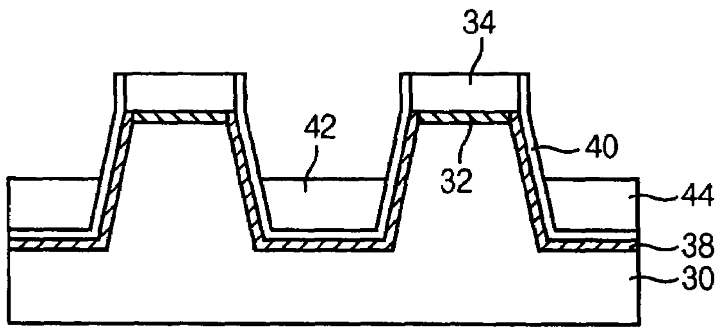
Figure 4C:
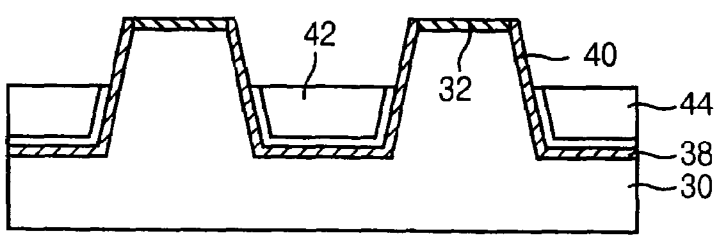

FIGS. 4*a* through 4*c* are cross-sectional diagram illustrating a method for manufacturing alignment mark of semiconductor device in accordance with the present invention.

Referring to FIG. 4*a*, a pad oxide film (not shown) and a pad nitride film (not shown) are sequentially formed on a semiconductor substrate 30. The pad nitride film and the pad oxide film are etched via a photoetching process using a device isolation mask (not shown) to form a pad nitride film pattern 34 and a pad oxide film pattern 32. The semiconductor substrate 30 is then etched using the pad nitride film pattern 34 as a mask to form an alignment mark trench 36. Preferably, the alignment mark trench 36 has a depth ranging from 2000 to 10000 Å and the pad nitride film has a thickness ranging from 300 to 2000 Å.

Thereafter, a well oxide film 38 and a liner nitride film 40 are formed on an inner wall of the alignment mark trench 36. An oxide film for device isolation film (not shown) filling the alignment mark trench 36 is then formed on the entire surface. Next, the oxide film for device isolation film is planarized until the pad nitride film pattern 34 is exposed to form a device isolation film 42. Preferably, the oxide film for device isolation film has a thickness ranging from 4000 to 15000 Å. The planarization process of the oxide film for device isolation film preferably comprises a CMP (Chemical Mechanical Polishing) process using a HSS having a selectivity ratio of nitride film and oxide film ranging from 1:10 to 1:200. The remaining portion of the nitride film pattern 34 after the planarization process preferably has a thickness ranging from 200 to 1000 Å.

Now referring to FIG. 4*b*, the device isolation film 42 is etched via a photoetching process using an alignment mark mask to form an alignment mark 44.

Referring to FIG. 4*c*, the pad nitride film pattern 14 is removed.

As discussed earlier, in accordance with the present invention, a predetermined thickness of a device isolation film is etched prior to removing a pad nitride film during a STI (Shallow Trench Isolation) process to increase contrast. The increased contrast improves recognition capability of the alignment mark, thereby improving yield and reliability of semiconductor device.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A method for manufacturing alignment mark of semiconductor device, the method comprising the steps of:

sequentially forming a pad oxide film and a pad nitride film on a semiconductor substrate;

selectively etching the pad nitride film and the pad oxide film to form a pad nitride film pattern and a pad oxide film pattern exposing a predetermined portion of the semiconductor substrate;

etching the semiconductor substrate using the pad nitride film pattern as a mask to form an alignment mark trench having a predetermined depth;

forming an oxide film for device isolation film filling the alignment mark trench on the entire surface;

planarizing the oxide film for device isolation film until the pad nitride film pattern is exposed to form a device isolation film; and etching a predetermined thickness of the device isolation film to form an alignment mark prior to removing the pad nitride film pattern.

2. The method according to claim 1, wherein the depth of the alignment mark trench ranges from 2000 to 10000 Å.

3. The method according to claim 1, wherein the pad nitride film has a thickness ranging from 300 to 2000 Å.

4. The method according to claim 1, wherein the oxide film for device isolation film has a thickness ranging from 4000 to 15000 Å.

5. The method according to claim 1, wherein the step of planarizing the oxide film for device isolation film comprises a CMP process using a high selectivity slurry having a selectivity ratio of nitride film to oxide film ranging from 1:10 to 1:200.

6. The method according to claim 1, wherein the thickness of the pad nitride film pattern after planarizing the oxide film for device isolation film ranges from 200 to 10000 Å.

7. The method according to claim 6, wherein the removing the pad nitride film pattern comprises a cleaning process using phosphoric acid.

* * * * *